US008163106B2

(12) United States Patent
Kikugawa et al.

(10) Patent No.: US 8,163,106 B2
(45) Date of Patent: Apr. 24, 2012

(54) R-FE-B BASED SINTERED MAGNET HAVING ON THE SURFACE THEREOF VAPOR DEPOSITED FILM OF ALUMINUM OR ALLOY THEREOF, AND METHOD FOR PRODUCING THE SAME

(75) Inventors: Atsushi Kikugawa, Osaka (JP); Koshi Yoshimura, Osaka (JP); Yoshimi Tochishita, Hyogo (JP); Masanao Kamachi, Saitama (JP); Nobuhiro Misumi, Hyogo (JP)

(73) Assignee: Hitachi Metals, Ltd., Tokyo (JP)

( * ) Notice: Subject to any disclaimer, the term of this patent is extended or adjusted under 35 U.S.C. 154(b) by 51 days.

(21) Appl. No.: 12/599,145

(22) PCT Filed: May 9, 2008

(86) PCT No.: PCT/JP2008/058661
§ 371 (c)(1),
(2), (4) Date: Jun. 9, 2010

(87) PCT Pub. No.: WO2008/140054
PCT Pub. Date: Nov. 20, 2008

(65) Prior Publication Data
US 2010/0295644 A1 Nov. 25, 2010

(30) Foreign Application Priority Data
May 9, 2007 (JP) .................................. 2007-124877

(51) Int. Cl.
*H01F 1/057* (2006.01)
(52) U.S. Cl. .................. 148/302; 428/692.1; 428/693.1

(58) Field of Classification Search ......................... None
See application file for complete search history.

(56) References Cited

U.S. PATENT DOCUMENTS

| 6,106,894 A | * | 8/2000 | Zapf | ............................. 427/127 |
| 6,391,386 B1 | * | 5/2002 | Nishiuchi et al. | ............. 427/250 |
| 2002/0028361 A1 | * | 3/2002 | Boire et al. | ................... 428/701 |

(Continued)

FOREIGN PATENT DOCUMENTS

JP 2001-335921 A1 12/2001

(Continued)

OTHER PUBLICATIONS

International Search Report for International Application No. PCT/JP2008/058661 dated Aug. 6, 2008.

*Primary Examiner* — John Sheehan
(74) *Attorney, Agent, or Firm* — Kratz, Quintos & Hanson, LLP

(57) ABSTRACT

An R—Fe—B sinlered magnet having on the surface thereof a vapor deposited film of aluminum or an alloy thereof and a method for producing the same. The vapor deposited film of aluminum or an alloy thereof comprises a columnar crystalline structure grown broader from the surface of the R—Fe—B sintered magnet body outward to the outer surface, which has a part within a region defined in the thickness direction of the film as taken from the surface of the R—Fe—B sintered magnet to ⅓ of the film thickness, 5 to 30 intercrystalline gaps of 0.01 μm to 1 μm in width as counted per 10 μm length in the lateral direction of the film. The method comprises controlling the average film formation rate such that it is slower up to a predetermined point and then is speeded up later thereon.

6 Claims, 1 Drawing Sheet

U.S. PATENT DOCUMENTS

| | | | |
|---|---|---|---|
| 2002/0127337 A1* | 9/2002 | Nishiuchi et al. | 427/250 |
| 2003/0108673 A1* | 6/2003 | Nishiuchi et al. | 427/250 |

FOREIGN PATENT DOCUMENTS

| | | | |
|---|---|---|---|
| JP | 2002-198240 A1 | | 7/2002 |
| JP | 2005-105311 | * | 4/2005 |
| JP | 2005-191276 | * | 7/2005 |
| JP | 2005-294558 A1 | | 10/2005 |
| WO | WO 2006/009137 A1 | | 1/2006 |

* cited by examiner

R-FE-B BASED SINTERED MAGNET HAVING ON THE SURFACE THEREOF VAPOR DEPOSITED FILM OF ALUMINUM OR ALLOY THEREOF, AND METHOD FOR PRODUCING THE SAME

TECHNICAL FIELD

The present invention relates to an R—Fe—B based sintered magnet having on the surface thereof a vapor deposited film of aluminum or an alloy thereof, which maintains excellent adhesion strength with the adhered object even after subjecting it to a severe heat cycle test, and to a method for producing the same.

BACKGROUND ART

An R—Fe—B based sintered magnet represented by an Nd—Fe—B based sintered magnet is employed today in various fields because it utilizes inexpensive materials abundant in resources and possesses superior magnetic characteristics, however, since it contains a highly reactive rare earth metal: R, it is apt to be oxidized and corroded in ambient. Accordingly, in many cases, a corrosion resistant film is formed on the surface of the R—Fe—B based sintered magnet when in practical use. Various coating films such as a metal film, are known as the corrosion resistant films to be formed on the surface of an R—Fe—B based sintered magnet, and among them, a vapor deposited aluminum film is known to have not only excellent corrosion resistance, but also superior adhesion reliability with an adhesive (i.e., delamination hardly occurs between the film and the adhesive up to the intrinsic fracture strength of the adhesive) which is required in the case of embedding a component. Accordingly, the rare earth metal-based permanent magnets having a vapor deposited aluminum film on the surface thereof are used, for example, by embedding them in various types of motors (Patent Document 1)

However, the R—Fe—B based sintered magnet having the vapor deposited aluminum film on the surface thereof and being embedded in the motor of automobiles, which, among the various types of motors, is exposed to severe temperature change in its environment of usage. Thus, excellent adhesion strength with the adhered object is required to be maintained, for instance, even after the magnet is subjected to a heat cycle test in the temperature range of −40° C. to 120° C.; however, this requirement is not easy to achieve. This is mainly attributed to the fact that the R—Fe—B based sintered magnet exhibits anisotropy in thermal expansion and shrinking (more specifically, the thermal expansion coefficient is $6.5 \times 10^{-6}/°$ C. in the direction parallel to the direction of magnetization, and is $-1.6 \times 10^{-6}/°$ C. in the direction perpendicular thereto). Thus, in the case an R—Fe—B based sintered magnet having a vapor deposited aluminum film on the surface thereof is subjected to a heat cycle test, the behavior of the R—Fe—B based sintered magnet according to the thermal history results differently from the behavior of the vapor deposited aluminum film formed on the surface of the magnet according to the thermal history; this causes a drop in adhesion strength due to the interfacial failure which occurs by the considerable deterioration in peeling strength ascribed to the strain and the stress generated at the interface between the magnet and the film. Accordingly, a method for solving such problems is demanded, but is yet to be proposed.

Patent Document 1: JP-A-2003-224944

DISCLOSURE OF THE INVENTION

Problems the Invention is to Solve

In the light of such circumstances, an objective of the present invention is to provide an R—Fe—B based sintered magnet having on the surface thereof a vapor deposited film of aluminum or an alloy thereof, which maintains excellent adhesion strength with the adhered object even after subjecting it to a severe heat cycle test, and a method for producing the same.

Means for Solving the Problems

The present inventors have intensively studied in the light of the circumstances above, and as a result, they have found that, on forming a vapor deposited film of aluminum or an alloy thereof on the surface of an R—Fe—B based sintered magnet, a coating film with a characteristic structure capable of relaxing or absorbing the strain and the stress generated at the interface between the magnet and the film, which are attributed to the difference in behaviors between them according to the thermal history by the heat cycle test, can be obtained by individually controlling the average film formation rate in the initial stage and in the later stage of the film formation as such that it is slower up to a predetermined point, and that it is speeded up later thereon.

One embodiment of the present invention that has been accomplished based on the above findings is an R—Fe—B based sintered magnet having on the surface thereof a vapor deposited film of aluminum or an alloy thereof characterized in that the vapor deposited film of aluminum or an alloy thereof comprises a columnar crystalline structure grown broader from the surface of the bulk magnet body outward to the outer surface, which has a part within a region defined in the thickness direction of the film as taken from the surface of the bulk magnet body to ⅓ of the film thickness, 5 to 30 intercrystalline gaps of 0.01 μm to 1 μm in width as counted per 10 μm length in the lateral direction of the film are existing at the part.

Further, the magnet of the present invention may be characterized in that the film has a part that the width of the crystal in the columnar crystalline structure is 0.1 μm to 1 μm within the region defined in the thickness direction of the film as taken from the surface of the bulk magnet body to ⅓ of the film thickness, and that it is 1 μm to 5 μm within the region of the remaining ⅔.

Furthermore, the magnet of the present invention may be characterized in that the vapor deposited film of aluminum or an alloy thereof is 3 μm to 20 μm in thickness.

In addition, a method for producing an R—Fe—B based sintered magnet having on the surface thereof a vapor deposited film of aluminum or an alloy thereof according to an embodiment of the present invention may be characterized in that, on forming the vapor deposited film of aluminum or an alloy thereof on the surface of the R—Fe—B based sintered magnet, the average film formation rate is controlled to be set to in a range of 0.1 μm/minute to 0.4 μm/minute until the film thickness reaches ⅓ of the desired thickness of the film, and which is thereafter set to in a range of 0.2 μm/minute to 1 μm/minute (provided that the latter rate is always higher than the former rate).

Further, one embodiment of the production method of the present invention may be characterized in that an apparatus for forming a vapor deposited film is used, in which the vapor deposition source of aluminum or an alloy thereof is supplied to the evaporating section for the vapor deposition material by wire feed method, and the vapor deposition source of aluminum or an alloy thereof is evaporated by resistance heating method in the evaporating section.

Effect of the Invention

According to the present invention, there is provided an R—Fe—B based sintered magnet having on the surface thereof a vapor deposited film of aluminum or an alloy thereof, which maintains excellent adhesion strength with the adhered object even after subjecting it to a severe heat cycle test, and a method for producing the same.

Figure 1:
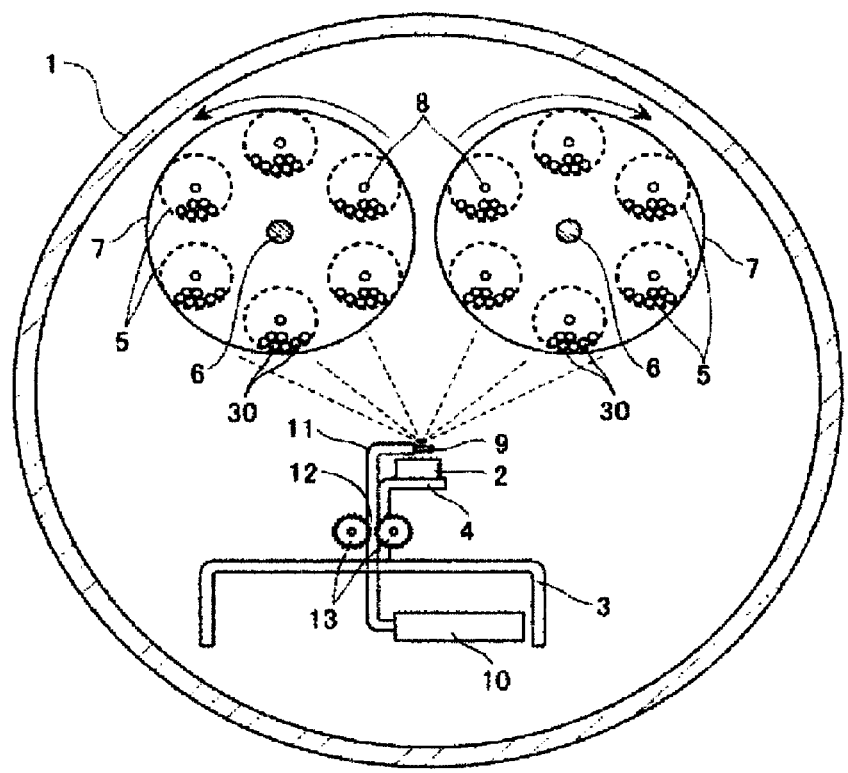
FIG. 1 It is a schematic front view (partly perspective view) showing the inside of a vacuum treating chamber of an apparatus for forming a vapor deposited film according to an embodiment, which is suitable for producing an R—Fe—B based sintered magnet according to the present invention, which has on the surface thereof a vapor deposited film of aluminum or an alloy thereof.

| Explanation of Symbols | |
| --- | --- |
| 1 | Vacuum treating chamber |
| 2 | Boat (evaporating section) |
| 3 | Support table |
| 4 | Boat support base |
| 5 | Cylindrical barrel |
| 6 | Rotary shaft |
| 7 | Support member |
| 8 | Support shaft |
| 9 | Wire as the vapor deposition material |
| 10 | Feed reel |
| 11 | Thermal resistant protective tube |
| 12 | Notched window |
| 13 | Feeding gear |
| 30 | Object to be treated |

BEST MODE FOR CARRYING OUT THE INVENTION

An R—Fe—B based sintered magnet having on the surface thereof a vapor deposited film of aluminum or an alloy thereof according to the present invention is characterized in that the vapor deposited film of aluminum or an alloy thereof comprises a columnar crystalline structure grown broader from the surface of the bulk magnet body outward to the outer surface, which has a part within a region defined in the thickness direction of the film as taken from the surface of the bulk magnet body to ⅓ of the film thickness, 5 to 30 intercrystalline gaps of 0.01 μm to 1 μm in width as counted per 10 μm length in the lateral direction of the film are existing at the part.

By forming, in at least a part of the vapor deposited film of aluminum or an alloy thereof formed on the surface of the R—Fe—B based sintered magnet, a columnar crystal of aluminum or an alloy thereof that is grown broader (broadened toward the end) from the surface of the bulk magnet body outward to the outer surface, in other words, by forming in the lower part of the film (the side nearer to the surface of the bulk magnet body) the columnar crystal of aluminum or an alloy thereof grown narrower in width than the columnar crystal of aluminum or an alloy thereof grown in the upper part of the film (the side nearer to the outer surface), many intercrystalline gaps in the lower part of the film can be incorporated to form a coarse structure which can thereby relax or absorb the strain and the stress generated at the interface between the magnet and the film which are attributed to the difference in behaviors between them according to the thermal history by the heat cycle test. Thus, the deterioration in peeling strength between the magnet and the film and the interfacial failure attributed thereto can be prevented from occurring, and excellent adhesion strength with the adhered object can be maintained even after subjecting to a heat cycle test. If the intercrystalline gaps of 0.01 μm to 1 μm in width are formed too few within the region defined in the thickness direction of the film as taken from the surface of the bulk magnet body to ⅓ of the film thickness (the region in the film between the surface of the bulk magnet body and ⅓ of the thickness), there is a possibility that the strain and the stress generated at the interface between the magnet and the film by the heat cycle test cannot be effectively relaxed or absorbed; on the other hand, too many intercrystalline gaps may possibly cause bad influence on peeling strength of the film to the surface of the magnet. The number of the intercrystalline gaps of 0.01 μm to 1 μm in width existing in the region defined in the thickness direction of the film as taken from the surface of the bulk magnet body to ⅓ of the film thickness is preferably 10 to 25 counted per 10 μm length in the lateral direction of the film. An intercrystalline gap larger than 1 μm in width is not preferred because it may badly influence the effect of imparting corrosion resistance of the film to the magnet.

Meanwhile, the columnar crystal of aluminum or an alloy thereof that is formed in the upper part of the film is provided as broad crystal so that this region yields a dense structure which blocks the intrusion of acids, alkalis or moisture from the outside; thus, this provides an effect of imparting excellent corrosion resistance to the magnet (preferably, this effect is enhanced by subjecting the surface of the film to a peening treatment). Under the premise that, in comparison with the number of the intercrystalline gaps of 0.01 μm to 1 μm in width existing in the region defined in the thickness direction of the film as taken from the surface of the bulk magnet body to ⅓ of the film thickness, there are fewer intercrystalline gaps of 0.01 μm to 1 μm in width within the region of the remaining ⅔, the coating film exhibits an effect of imparting excellent corrosion resistance to the magnet so long that there are 10 gaps in maximum, preferably, 5 gaps or fewer as counted per 10 μm length in the lateral direction of the film.

The number of intercrystalline gaps of 0.01 μm to 1 μm in width can be measured by observing an arbitrarily selected cross section taken in the longitudinal direction of the vapor deposited film of aluminum or an alloy thereof under a field emission type scanning electron microscope and the like, and by counting the gaps in an arbitrarily selected lateral region of 10 μm length. For instance, the number of the gaps existing in the region defined in the thickness direction of the film as taken from the surface of the bulk magnet body to ⅓ of the film thickness can be obtained by measuring in the vicinity of the central part in the thickness direction of that region (i.e., the part accounting about ⅙ from the surface of the bulk magnet body), and the number of the gaps existing in the region of the remaining ⅔ can be obtained by measuring in the vicinity of the central part in the thickness direction of that region (i.e., the part accounting about ⅘ from the surface of the bulk magnet body). Preferably, at the measurement, the cross section of the film is processed in advance by using ion beam cross-section processing and the like so that the cross section may not be deformed.

In the vapor deposited film of aluminum or an alloy thereof formed on the surface of the R—Fe—B based sintered magnet, it is preferred that the width of the crystal in the columnar crystalline structure of at least a part of the film is 0.1 µm to 1 µm within the region defined in the thickness direction of the film as taken from the surface of the bulk magnet body to ⅓ of the film thickness, and that it is 1 µm to 5 µm within the region of the remaining ⅔, in the point that the strain and the stress generated at the interface between the magnet and the film by the heat cycle test can be effectively relaxed or absorbed.

The vapor deposited film of aluminum or an alloy thereof having such a characteristic structure as stated above can be formed on the surface of the R—Fe—B based sintered magnet by controlling the average film formation rate, for instance, the rate is set to in a range of 0.1 µm/minute to 0.4 µm/minute until the film thickness reaches ⅓ of the desired thickness of the film, and which is thereafter set to in a range of 0.2 µm/minute to 1 µm/minute, preferably, to in a range of 0.3 µm/minute to 0.6 µm/minute (provided that the latter rate is always higher than the former rate). The reason why the desired film formation can be achieved by individually controlling the average film formation rate in the initial stage and in the later stage of the film formation is presumed as follows. That is, the surface of the R—Fe—B based sintered magnet just before the film formation has irregularities with Ra in a range of about 0.8 µm to 1.5 µm by being subjected to processing and cleaning steps in advance. Furthermore, the surface structure of the R—Fe—B based sintered magnet comprises a part of an $R_2Fe_{14}B$ phase and a part of an R-rich phase, there is a difference in ease of oxidation between the $R_2Fe_{14}B$ phase and the R-rich phase, and the R-rich phase is more easily oxidized. During the formation of the vapor deposited aluminum film, aluminum particles deposit one after another on the surface of the magnet, whereas during the formation of the vapor deposited aluminum alloy film, aluminum particles and particles of other metal which constitute the aluminum alloy deposit one after another on the surface of the magnet, to thereby develop the columnar crystal. However, because the surface of the magnet is not uniform both in shape and in structure as stated above, in the initial stage of the film formation in which the average film formation rate is slow, there generate a part with stable deposition of the aluminum particles (and the particles of the other metal) and other part with unstable deposition. The aluminum particles (and the particles of the other metal) preferentially deposit on the convex parts and on the parts of the $R_2Fe_{14}B$ phase, but they are less apt to deposit on the concave parts and on the parts of the R-rich phase. As a result, the columnar crystal of aluminum or an alloy thereof which grows on the convex parts and on the parts of the $R_2Fe_{14}B$ phase become narrower, whereas moderate intercrystalline gaps are formed on the concave parts and on the parts of the R-rich phase. On the other hand, in the later stage of the film formation in which the average film formation rate is faster than that in the initial stage of the film formation, the aluminum particles (and the particles of the other metal) deposit more rapidly and in larger amount on the already grown columnar crystal. Thus, the crystal gradually broadens to reduce the intercrystalline gaps. Hence, the structure of the vapor deposited film of aluminum or an alloy thereof formed in this manner becomes coarser in the lower part and denser in the upper part.

The method for forming the vapor deposited film of aluminum or an alloy thereof on the surface of the R—Fe—B based sintered magnet above can be performed easily by using an apparatus for forming a vapor deposited film in which the vapor deposition source of aluminum or an alloy thereof is supplied to the evaporating section for the vapor deposition material by wire feed method, and the vapor deposition source of aluminum or an alloy thereof is evaporated by resistance heating method in the evaporating section. For instance, there can be mentioned an apparatus for forming a vapor deposited film described in JP-A-2001-335921, which comprises a vacuum treating chamber in which an evaporating section for a vapor deposition material and a cylindrical barrel formed of a mesh net for accommodating therein the object to be treated by vapor depositing the vapor deposition material on the surface thereof are located; the cylindrical barrel is supported circumferentially outside a horizontal rotational axis of a support member rotatable about the rotational axis, for rotation about the rotational axis, the distance between the cylindrical barrel rotated about the rotational axis of the support member and the evaporating section can be varied by rotating the support member, while a wire-shaped vapor deposition material is continuously supplied to the heated evaporating section and evaporated, so that a vapor deposited film may be formed on the surface of the object to be treated.

FIG. 1 is a schematic front view (partly perspective view) showing the inside of a vacuum treating chamber of an apparatus for forming a vapor deposited film mentioned above according to an embodiment, which is described in JP-A-2001-335921. At an upper portion in the vacuum treating chamber 1 that is connected to a vacuum evacuation system which is not shown, two support members 7 rotatable about a rotary shaft 6 on a horizontal rotational axis are disposed side-by-side, and six cylindrical barrels 5 formed of a mesh net of a stainless steel are supported in an annular shape circumferentially outside the rotary shaft 6 of the support member 7 by support shaft 8 for rotation about the rotational axis. Furthermore, at a lower portion in the vacuum treating chamber 1, a plurality of boats 2, which are evaporating sections for evaporating a vapor deposition material, are disposed on a boat support base 4 risen on a support table 3. A wire 9 as the vapor deposition material is retained and wound around a feed reel 10 below the support table 3. The proceeding end of the wire 9 as the vapor deposition material is guided to above the boat 2 by a thermal resistant protective tube 11 facing toward an inner surface of the boat 2. A notched window 12 is provided in a portion of the protective tube 11, and feeding gears 13 mounted in correspondence to the notched window 12 is brought into direct contact with the wire 9 as the vapor deposition material, such that the vapor deposition material is constantly supplied into the boat 2 by feeding the wire 9 as the vapor deposition material, and the film formation rate of the vapor deposited film can be controlled as desired by adjusting the feeding speed of the wire 9 as the vapor deposition material. Moreover, when the support member 7 is rotated about the rotary shaft 6 (see the arrow shown in FIG. 1), the cylindrical barrel 5 supported by the support shaft 8 circumferentially outside the rotary shaft 6 of the support member 7 is rotated about the rotary shaft 6 in response to the rotation of the support member 7. As a result, the distance between each of the cylindrical barrels and the evaporating section disposed below the support member is varied as to exhibit the following effect. That is, the cylindrical barrel located at a lower part of the support member 7 is close to the evaporating section. Accordingly, the vapor deposited film is efficiently formed on the surface of the object to be treated 30 accommodated in this cylindrical barrel. On the other hand, the object to be treated accommodated in the cylindrical barrel moved away from the evaporating section is freed from the heating state and cooled by an amount corresponding to a distance from the evaporating section. Thus, during this time, the softening of the vapor deposited film formed on the surface thereof is prevented from occurring. In this way, by using this apparatus for forming a vapor deposited film, the efficient formation of the vapor deposited film and the suppression of the softening of the thus formed vapor deposited film can be achieved at the same time.

The thickness of the vapor deposited film of aluminum or an alloy thereof formed on the surface of the R—Fe—B based sintered magnet is preferably 3 μm to 20 μm. If the thickness is less than 3 μm, the effect of imparting excellent corrosion resistance to the magnet may not be obtained; on the other hand, if the thickness exceeds 20 μm, it takes longer for the film formation, which allows the narrow columnar crystal of aluminum or an alloy thereof formed in the lower part of the film to grow in the lateral direction, thereby resulting in decreased the number of the intercrystalline gaps to destroy the coarse structure in the lower part of the film.

The R—Fe—B based sintered magnet of the present invention is not particularly limited so long as it is a sintered magnet which contains at least an R, Fe, and B as the constituting components. Moreover, when the vapor deposited film formed on the surface thereof is an aluminum alloy vapor deposited film, the metal component other than aluminum is preferably 10 mass % or less. For instance, a vapor deposited aluminum alloy film containing a mass % to 7 mass % of magnesium as a metal component other than aluminum is preferred from the viewpoint that it has excellent resistance to brine water. The vapor deposited film of aluminum or an alloy thereof may contain inevitably incorporated trace amount of components.

EXAMPLES

The present invention is explained in further detail below by way of examples, but it should not be understood that the present invention is limited thereto. In the following Examples and Comparative Examples, a sintered magnet having a dimension of 50 mm in height×20 mm in length×2 mm in width and a composition of $Nd_{14}Fe_{79}B_6Co_1$ (at %) (which is referred to hereinafter as "magnet test piece") was used, which was prepared according to a process described in, for example, U.S. Pat. Nos. 4,770,723 and 4,792,368; i.e., by pulverizing a known cast ingot and then subjecting the resulting powder to a pressing, a sintering, a heat treatment and a surface working.

Example 1

Production of a Magnet Test Piece Having on the Surface Thereof a Vapor Deposited Aluminum Film The apparatus for forming a vapor deposited film as shown in FIG. 1 was used in the following manner. The 12 cylindrical barrels disposed in the vacuum treating chamber were each 110 mm in diameter and 600 mm in length, and were each fabricated by using a mesh net of a stainless steel (having an opening area of approximately 80%, 10 mm side square openings and a wire width of 2 mm).

A magnet test piece was subjected to sand blasting to remove the oxidized layer formed on the surface of the test piece during the surface working in the previous step. The magnet test pieces from which the oxidized layer had been removed were placed inside each cylindrical barrel at the number of the test pieces shown in Table 1, and after vacuum evacuating the inside of the vacuum chamber until the total pressure reached $5 \times 10^{-2}$ Pa or lower, Ar gas was introduced until the total pressure of 1 Pa was achieved, to thereby clean the surface of the magnet test pieces by applying glow discharge for 15 minutes under bias voltage of −0.3 kV while rotating the rotary shaft of the barrel at 5.0 rpm.

Subsequently, the rotary shaft of the barrel was rotated at 5.0 rpm under the conditions of Ar gas pressure of 1 Pa and bias voltage of −0.3 kV, to form a vapor deposited aluminum film on the surface of the magnet test piece by ion plating; the film formation rate of the vapor deposited aluminum film was controlled to the rate shown in Table 1 by adjusting the feeding speed of an aluminum wire, and the aluminum wire was continuously supplied to the evaporating section, where it was heated and vaporized for ionization.

(Evaluation of the Magnet Test Piece Having on the Surface Thereof the Vapor Deposited Aluminum Film)

The magnet test piece having on the surface thereof the vapor deposited aluminum film produced as described above was subjected to glass peening treatment to densify the surface of the film, and was then adhered to a yoke material by using an adhesive to obtain a joined test body to be used in a heat cycle test. As the yoke material, a sand blasted S45C carbon steel was used, and a thermosetting epoxy adhesive, XNR3628 (Nagase ChemteX Corporation) was used as the adhesive. The thickness of the adhesive was defined by incorporating a nichrome wire of 200 μm in wire diameter between the yoke material and the magnet test piece having on the surface thereof the vapor deposited aluminum film.

The heat cycle test was applied to the joined test body by using an Air-to-air thermal shock chamber, NT 510 (Kusumoto Chemicals, Ltd.), by setting 1 cycle at conditions of 120° C. for 30 minutes to −40° C. for 30 minutes. The temperature of the joined test body was measured by inserting a thermocouple inside the joined test body. The performance evaluation of the vapor deposited aluminum film formed on the surface of the magnet test piece was effected by comparing adhesion strength of the joined test body before and after carrying out the heat cycle test for 200 cycles. The evaluation about the joined test body before and after carrying out the heat cycle test for 200 cycles was effected out by using a universal testing machine, AG-10TB (Shimadzu Corporation); shear strength was measured at a cross head speed of 2 mm/minute, and the adhesion strength reduction ratio was evaluated with the shear strength reduction ratio obtained by taking shear strength after applying 200 cycles of the heat cycle test with respect to that before applying the test. The results are given in Table 2. In Table 2 is also given the appearance of the plane of breakage after measuring shear strength. Table 2 clearly shows that, by individually controlling the film formation rate of the vapor deposited aluminum film formed on the surface of the magnet test piece in the initial stage and in the later stage of the film formation, the adhesion strength reduction ratio can be suppressed to a mere 6%, and the joined test body exhibited extremely superior resistance against the heat cycle. Furthermore, the appearance of the plane of breakage after measuring shear strength suggested that the breakage was due to the cohesion failure of the adhesive. Thus, it has been found that peeling strength between the magnet test piece and the vapor deposited aluminum film and adhesion strength between the vapor deposited aluminum film and the adhesive were both very high.

Figure 2:
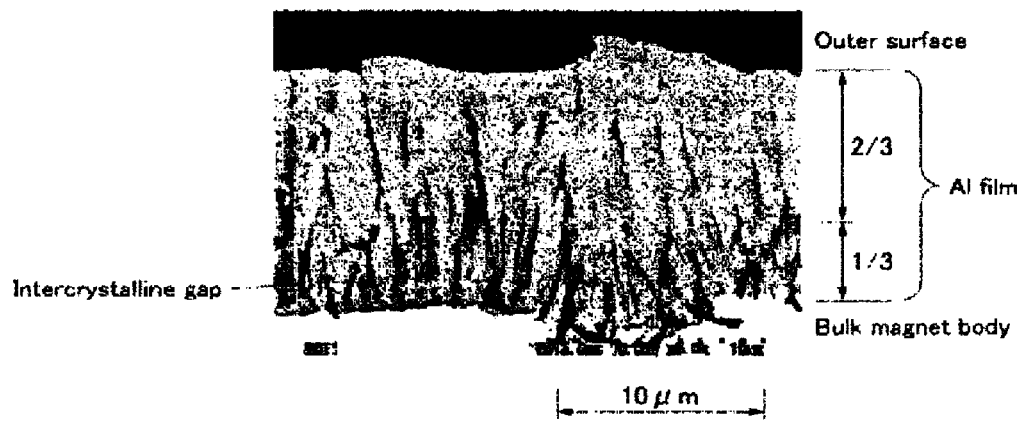
FIG. 2 It is a cross-section photograph of a vapor deposited aluminum film formed on the surface of a magnet test piece according to Example 1.

Furthermore, the magnet test piece having the vapor deposited aluminum film on the surface thereof was subjected to cross-section processing by using an ion beam cross-section polisher, SM09010 (JEOL Ltd.) to observe the processed cross section with a field emission type scanning electron microscope, S-4300 (Hitachi, Ltd.). In FIG. 2 is given the cross-section photograph of the vapor deposited aluminum film formed on the surface of the magnet test piece. FIG. 2 clearly shows that, in the region defined in the thickness direction of the vapor deposited aluminum film formed on the surface of the magnet test piece as taken from the surface of the magnet test piece to ⅓ of the film thickness, there are numerous narrow columnar crystals of aluminum having the width of the crystal of 0.1 μm to 1 μm, and at the same time, many parts comprising 10 to 15 intercrystalline gaps of 0.01 μm to 1 μm in width as counted per 10 μm length in the lateral direction of the film. On the other hand, in the region of the remaining ⅔, the columnar crystal of aluminum that constitutes the region is broader with the width of the crystal of 1 μm to 5 μm, and in point of the intercrystalline gaps of 0.01 μm to 1 μm in width, there are many parts in which no or very few, i.e., 5 gaps in maximum as counted per 10 μm length in the lateral direction of the film exist. From these results, the reasons why the bulk magnet test piece having on the surface thereof the vapor deposited aluminum film that was obtained in this Example maintains excellent adhesion strength with the yoke material even after subjecting it to the heat cycle test and exhibits excellent corrosion resistance (which was confirmed separately with a standard corrosion resistance test) were presumed attributable to the characteristic structure intrinsic to the vapor deposited aluminum film formed on the surface of the magnet test piece.

Comparative Example 1

The formation of a vapor deposited aluminum film on the surface of a magnet test piece was carried out from the beginning to the completion at the film formation rate shown in Table 1 to obtain the magnet test piece having on the surface thereof the vapor deposited aluminum film, which were evaluated in the same manner as in Example 1. The results are given in Table 2. Table 2 clearly shows that the magnet test piece having on the surface thereof the vapor deposited aluminum film that was obtained in this Comparative Example markedly loses adhesion strength by carrying out the heat cycle test, and that the appearance of the plane of breakage after measuring shear strength suggested that the breakage was due to not only the cohesion failure of the adhesive, but also the interfacial failure between the adhesives and the film. The cross section observation of the vapor deposited aluminum film formed on the surface of the magnet test piece was effected in the same manner as in Example 1, and it has been found that a dense structure comprising narrow columnar crystal of aluminum was developed over the entire thickness of the film, with few intercrystalline gaps. Thus, the reason why the performance of the magnet test piece having on the surface thereof the vapor deposited aluminum film that was obtained in this Comparative Example is inferior (except corrosion resistance which is comparable) to that of the magnet test piece having on the surface thereof the vapor deposited aluminum film that was obtained in Example 1 was presumed attributable to the difference in the structure of the vapor deposited aluminum film formed on the surface of the magnet test piece.

Comparative Example 2

The formation of a vapor deposited aluminum film on the surface of a magnet test piece was carried out from the beginning to the completion at the film formation rate shown in Table 1 to obtain the magnet test piece having on the surface thereof the vapor deposited aluminum film, which were evaluated in the same manner as in Example 1. The results are given in Table 2. Table 2 clearly shows that the magnet test piece having on the surface thereof the vapor deposited aluminum film that was obtained in this Comparative Example markedly loses adhesion strength by carrying out the heat cycle test, and that the appearance of the plane of breakage after measuring shear strength suggested that the breakage was due to not only the cohesion failure of the adhesive, but also the interfacial failure between the adhesive and the film. The cross section observation of the vapor deposited aluminum film formed on the surface of the magnet test piece was effected in the same manner as in Example 1, and it has been found that a dense structure comprising wide columnar crystal of aluminum was developed over the entire thickness of the film, with few intercrystalline gaps. Thus, the reason why the performance of the magnet test piece having on the surface thereof the vapor deposited aluminum film that was obtained in this Comparative Example is inferior (except corrosion resistance which is comparable) to that of the magnet test piece having on the surface thereof the vapor deposited aluminum film that was obtained in Example 1 was presumed attributable to the difference in the structure of the vapor deposited aluminum film formed on the surface of the magnet test piece.

TABLE 1

| | Number of magnet test piece placed in each barrel | Film formation conditions (rate and time) | | Preset film thickness |
|---|---|---|---|---|
| | | Initial stage | Later stage | |
| Example 1 | 50 | 0.2 μm/min. × 15 minutes | 0.5 μm/min. × 12 minutes | 9 μm |
| Comp. Ex. 1 | 100 | 0.05 μm/min. × 100 minutes | | 5 μm |
| Comp. Ex. 2 | 10 | 1 μm/min. × 10 minutes | | 10 μm |

TABLE 2

| | Adhesion Strength Reduction ratio | Appearance of plane of breakage after measuring shear strength |
|---|---|---|
| Example 1 | 6% | Cohesion failure of adhesive |
| Comp. Ex. 1 | 43% | Cohesion failure of adhesive (60%) and adhesive/film interfacial failure (40%) |
| Comp. Ex. 2 | 58% | Cohesion failure of adhesive (50%) and adhesive/film interfacial failure (50%) |

Example 2

A vapor deposited aluminum alloy film containing 5 mass % of magnesium was formed on the surface of a magnet test piece in the same manner as in Example 1, except for using an aluminum alloy wire containing 5 mass % of magnesium (JIS A5356 compliant), and the evaluation similar to that in Example 1 was effected. As a result, the adhesion strength reduction ratio was found to be merely 8%, and the joined test body exhibited extremely superior resistance against the heat cycle. Furthermore, the appearance of the plane of breakage after measuring shear strength suggested that the breakage was due to the cohesion failure of the adhesive. Thus, it has been found that peeling strength between the magnet test piece and the vapor deposited aluminum film and adhesion strength between the vapor deposited aluminum film and the adhesive were both very high. The cross section observation of the vapor deposited aluminum alloy film formed on the surface of the magnet test piece was effected, and it has been found that, in the region defined in the thickness direction of the vapor deposited aluminum alloy film formed on the surface of the magnet test piece as taken from the surface of the magnet test piece to ⅓ of the film thickness, there are numerous narrow columnar crystals of aluminum alloy having the width of the crystal of 0.1 μm to 1 μm, and at the same time, many parts comprising 10 to 15 intercrystalline gaps of 0.01 μm to 1 μm in width as counted per 10 μm length in the lateral direction of the film. On the other hand, in the region of the remaining ⅔, the columnar crystal of aluminum alloy that constitutes the region is broader with the width of the crystal of 1 μm to 5 μm, and in point of the intercrystalline gaps of 0.01 μm to 1 μm in width, there are many parts in which no or very few, i.e., 5 gaps in maximum as counted per 10 μm length in the lateral direction of the film exist. Thus, the structure is similar to the structure of the vapor deposited aluminum film formed on the surface of the magnet test piece in Example 1.

INDUSTRIAL APPLICABILITY

The present invention has an industrial applicability in the point that it can provide an R—Fe—B based sintered magnet having on the surface thereof a vapor deposited film of aluminum or an alloy thereof, which maintains excellent adhesion strength with the adhered object even after subjecting it to a severe heat cycle test, and a method for producing the same.

The invention claimed is:

1. An R—Fe—B based sintered magnet having on its surface a vapor deposited film of aluminum or an alloy thereof, characterized in that the vapor deposited film of aluminum or an alloy thereof comprises a columnar crystalline structure grown broader from the surface of the R—Fe—B based sintered magnet outward to an outer surface of the vapor deposited film aluminum or an alloy thereof, wherein the vapor deposited film of aluminum or an alloy thereof has a part within a region defined in the thickness direction of the film as taken from the surface of the bulk magnet body to ⅓ of the film thickness, the part having 5 to 30 intercrystalline gaps of 0.01 μm to 1 μm in width as counted per 10 μm length in the lateral direction of the film.

2. The magnet as claimed in claim 1, characterized in that a width of the crystal in the columnar crystalline structure is 0.1 μm to 1 μm in the part within the region defined in the thickness direction of the film as taken from the surface of the magnet body to ⅓ of the film thickness, and that a width of the crystal in the columnar crystalline structure is 1 μm to 5 μm in a second part within the region of the remaining ⅔ in the thickness direction of the film.

3. The magnet as claimed in claim 2, characterized in that the vapor deposited film of aluminum or an alloy thereof is 3 μm to 20 μm in thickness.

4. A method for producing an R—Fe—B based sintered magnet having on its surface a vapor deposited film of aluminum or an alloy thereof described in claim 1, characterized in that, on forming the vapor deposited film of aluminum or an alloy thereof on the surface of the R—Fe—B based sintered magnet, an average film formation rate is controlled to be set to a range of 0.1 μm/minute to 0.4 μm/minute until the film thickness reaches ⅓ of the desired thickness of the film, and the average film formation rate is thereafter set to a range of 0.2 μm/minute to 1 μm/minute, the latter rate being higher than the former rate.

5. The production method as claimed in claim 4, characterized in that an apparatus for forming a vapor deposited film is used, in which a vapor deposition source of aluminum or an alloy thereof is supplied to an evaporating section for a vapor deposition material by wire feed method, and the vapor deposition source of aluminum or an alloy thereof is evaporated by resistance heating method in the evaporating section.

6. The magnet as claimed in claim 1, characterized in that the vapor deposited film of aluminum or an alloy thereof is 3 μm to 20 μm in thickness.

\* \* \* \* \*